(12) United States Patent
Tan et al.

(10) Patent No.: US 11,101,584 B2
(45) Date of Patent: Aug. 24, 2021

(54) DATA CABLE

(71) Applicant: Dongguan Yuanchuang Electronic Technology Co., Ltd, Dongguan (CN)

(72) Inventors: Hongping Tan, Guangdong (CN); Xinxin Tan, Guangdong (CN)

(73) Assignee: Dongguan Yuanchuang Electronic Technology Co., Ltd, Dongguan (CN)

( * ) Notice: Subject to any disclaimer, the term of this patent is extended or adjusted under 35 U.S.C. 154(b) by 0 days.

(21) Appl. No.: 16/893,368

(22) Filed: Jun. 4, 2020

(65) Prior Publication Data

US 2021/0066829 A1 Mar. 4, 2021

(30) Foreign Application Priority Data

Sep. 2, 2019 (CN) .......................... 201921459895.X
Apr. 30, 2020 (CN) .......................... 202020712639.3
Apr. 30, 2020 (CN) .......................... 202020718719.X

(51) Int. Cl.

| H01R 29/00 | (2006.01) |
| H01R 12/71 | (2011.01) |
| H01R 13/10 | (2006.01) |
| H01R 12/70 | (2011.01) |

(52) U.S. Cl.
CPC ......... *H01R 12/71* (2013.01); *H01R 12/7076* (2013.01); *H01R 13/10* (2013.01)

(58) Field of Classification Search
CPC ..... H01R 12/71; H01R 12/7076; H01R 13/10
USPC ......................................................... 439/45
See application file for complete search history.

(56) References Cited

U.S. PATENT DOCUMENTS

| 2,027,447 | A | * | 1/1936 | Percy ..................... | H01R 24/28 |
| | | | | | 439/694 |
| 2,305,101 | A | * | 12/1942 | O'Brien ................. | H02G 11/02 |
| | | | | | 439/4 |
| 4,773,867 | A | * | 9/1988 | Keller .................... | H04Q 1/142 |
| | | | | | 379/325 |
| 4,990,094 | A | * | 2/1991 | Chandler ........... | H01R 13/6596 |
| | | | | | 439/108 |
| 6,786,734 | B2 | * | 9/2004 | Yu ......................... | H01R 35/02 |
| | | | | | 439/11 |
| 6,991,467 | B1 | * | 1/2006 | Cheng .................... | H01R 31/06 |
| | | | | | 439/10 |
| 7,025,595 | B1 | * | 4/2006 | Chan ..................... | H01R 35/04 |
| | | | | | 439/6 |

(Continued)

*Primary Examiner* — Abdullah A Riyami
*Assistant Examiner* — Vladimir Imas
(74) *Attorney, Agent, or Firm* — Andrew C. Cheng

(57) ABSTRACT

The present invention relates to the field of electronic device accessory technology and in particular to a data cable. The data cable includes a data cable plug and an adapter element which are in rotational connection. The data cable plug includes at least two metal sheets. A space for rotational connection of the adapter element is formed between two of the metal sheets. When the adapter element is rotationally connected in the space, not only can the electrical connection between the adapter element and the data cable plug be guaranteed, but also an angle of the adapter element relative to the data cable plug can be well adjusted. Therefore, use requirements of a user are satisfied. Meanwhile, the situation that a cable body connected to a power supply is bent repeatedly to adversely affect the service life of the data cable will be avoided.

15 Claims, 8 Drawing Sheets

(56) References Cited

U.S. PATENT DOCUMENTS

| | | | | |
|---|---|---|---|---|
| 7,066,753 B1* | 6/2006 | Tseng | H01R 35/02 | 439/259 |
| 7,179,099 B2* | 2/2007 | Hsieh | H01R 13/6658 | 439/131 |
| 7,234,963 B1* | 6/2007 | Huang | H01R 13/56 | 439/446 |
| 7,462,074 B1* | 12/2008 | Devlin | H01R 13/652 | 439/106 |
| 7,473,141 B2* | 1/2009 | Liao | H01R 13/62 | 439/638 |
| 7,510,420 B2* | 3/2009 | Mori | G06F 13/4022 | 379/446 |
| 7,556,535 B2* | 7/2009 | Liao | H01R 13/6273 | 439/640 |
| 7,566,223 B2* | 7/2009 | Wadsworth | H01R 35/04 | 439/21 |
| 7,789,711 B2* | 9/2010 | Wu | H01R 24/68 | 439/640 |
| 8,002,554 B2* | 8/2011 | Wadsworth | H01R 39/64 | 439/18 |
| 8,096,820 B2* | 1/2012 | Lyu | H01R 27/02 | 439/141 |
| 8,157,569 B1* | 4/2012 | Liu | H01R 35/04 | 439/11 |
| 8,298,003 B2* | 10/2012 | Wu | H01R 31/005 | 439/501 |
| 8,651,874 B2* | 2/2014 | Ku | H01R 35/02 | 439/31 |
| 8,684,753 B2* | 4/2014 | Zhang | H01R 13/6658 | 439/131 |
| 8,747,119 B2* | 6/2014 | Hsu | H01R 24/30 | 439/13 |
| 8,777,671 B2* | 7/2014 | Huang | H01R 35/04 | 439/640 |
| 8,979,549 B2* | 3/2015 | Lin | H01R 35/04 | 439/31 |
| 9,385,464 B2* | 7/2016 | Wu | H01R 27/02 | |
| 9,466,899 B1* | 10/2016 | Chen | H01R 12/716 | |
| 9,692,170 B2* | 6/2017 | Choi | H01R 13/5219 | |
| 10,027,080 B2* | 7/2018 | Solland | H01R 27/00 | |
| 10,367,367 B1* | 7/2019 | Jacobs | G04G 19/00 | |
| 10,483,704 B1* | 11/2019 | Solland | H01R 35/00 | |
| 10,873,190 B2* | 12/2020 | Chien | F21V 23/023 | |
| 10,950,962 B2* | 3/2021 | Schmidbauer | H01R 12/732 | |
| 2007/0197052 A1* | 8/2007 | Liao | H01R 31/06 | 439/11 |
| 2012/0238146 A1* | 9/2012 | Liao | H01R 31/06 | 439/660 |
| 2013/0072069 A1* | 3/2013 | Gao | H01R 13/113 | 439/660 |
| 2013/0171864 A1* | 7/2013 | Farris-Gilbert | H01R 31/06 | 439/445 |
| 2015/0140843 A1* | 5/2015 | Wu | H01R 27/00 | 439/142 |
| 2016/0294133 A1* | 10/2016 | Xie | H01R 27/02 | |
| 2019/0341793 A1* | 11/2019 | Chien | F21V 33/004 | |

* cited by examiner

DATA CABLE

TECHNICAL FIELD

The present invention relates to the field of electronic device accessory technology, and in particular to a data cable.

BACKGROUND

A data cable, an essential accessory for charging and data transmission of a mobile device, generally includes an adapter plugged into an electronic device and a cable body connected to the adapter. In the existing data cable, the relative direction of the adapter to the cable body is always fixed, which makes it inconvenient to use; or during use, repeated bending of the cable body may easily cause the cable body to be separated from the adapter, which adversely affects the service life of the data cable.

SUMMARY

In order to avoid the defect of a short service life of a conventional data cable due to the fact that an adapter portion is easily separated from a cable body, the present invention provides a data cable.

The present invention provides a data cable, including a data cable plug and an adapter element which are in rotational connection. The data cable plug includes at least two metal sheets opposite to each other. A space for rotational connection of the adapter element is formed between two of the metal sheets. The adapter element is provided with contact lines electrically connected to the metal sheets and the contact lines include arc structures.

Preferably, an adapter plate includes two oppositely arranged main surfaces and a top surface that connects the two main surfaces. The contact lines electrically connected to the metal sheets are disposed on the main surfaces. The data cable further includes a second metal sheet corresponding to the top surface and disposed between the metal sheets. The top surface is provided with a contact line corresponding to the second metal sheet.

Preferably, the number of the metal sheets is four, the four metal sheets are divided into two groups, and the two metal sheets in each group are symmetrically disposed.

Preferably, at least one contact line is disposed on each main surface, and the contact lines on the same main surface are disposed in the form of concentric circles when the number of the contact lines on each main surface is greater than or equal to two.

Preferably, the adapter element includes an adapter plate in rotational connection with the data cable plug, and the adapter plate includes an arc structure and has a rotation angle of smaller than or equal to 180°.

Preferably, the contact line has a radian of greater than 180° and smaller than 360°.

Preferably, the data cable further includes a fixing seat provided with a clamping groove for adaptation of the adapter element, and the clamping groove is communicated with the space formed between the metal sheets to form a space for adaptation of the adapter element.

Preferably, the data cable further includes a connecting shaft that passes through the fixing seat and the adapter element.

Preferably, the number of the metal sheets is four, the four metal sheets are oppositely disposed in two groups, and the metal sheets and the second metal sheet are defined as a D+ pin, a D− pin, a Vcc+ pin, a GND pin and a CC pin.

Preferably, the data cable further includes a PCB and a terminal for being connected to an interface of an electronic device. The metal sheets and the second metal sheet are disposed on the side, close to the adapter element, of the PCB. The fixing seat fixedly and electrically connects the PCB with the terminal. A direction in which the terminal is connected to the electronic device is perpendicular to a connecting surface of the PCB and the terminal.

Preferably, the terminal is configured to be plugged into the interface of the electronic device and includes any one of a type-C terminal, a micro-USB terminal and a Lightning terminal; or the terminal is a magnetic plug capable of being magnetically connected to a peripheral connector for being plugged into the electronic device.

Preferably, when being the magnetic plug, the terminal includes a first magnetic part connected to the fixing seat and at least one thimble disposed inside the first magnetic part. The thimble is electrically connected to the PCB and the peripheral connector. The peripheral connector includes a second magnetic part. The first magnetic part and the second magnetic part are designed to be circular or elliptical. The terminal magnetically attracts the peripheral connector by 360° or adapts to the peripheral connector by 180°.

Preferably, the metal sheet includes a fixing segment fixedly connected to the PCB, a supporting segment connected to the fixing segment and protruding out of a surface of the PCB and a conductive contact disposed on the supporting segment and electrically connected to the adapter element.

Preferably, the supporting segment is of a bent platy structure and is formed in such a manner that an end connected to the fixing segment extends over a certain height, then is bent, afterwards continues to extend to the side close to the PCB and is not in contact with the PCB. The conductive contact is disposed on part of the structure, extending toward the PCB, of each supporting segment. A space for accommodating the adapter element is formed between the two groups of opposite conductive contacts.

Preferably, the metal sheet further includes a connecting segment connected to the part of the structure, extending toward the PCB, of each supporting segment. The connecting segment is a bent plate. The end, away from the supporting segment, of the connecting segment protrudes toward one group of opposite metal sheets. The two contacts connected to the connecting segments of the same group of metal sheets are unequally spaced from the PCB.

Compared with the prior art, the data cable according to the present invention includes the data cable plug and the adapter element which are in rotational connection. The data cable plug includes at least two metal sheets opposite to each other. The space for rotational connection of the adapter element is formed between two of the metal sheets. The adapter element is provided with the contact lines electrically connected to the metal sheets and the contact lines include the arc structures. When the adapter element is rotationally connected in the space, not only can the electrical connection between the adapter element and the data cable plug be guaranteed, but also an angle of the adapter element relative to the data cable plug can be well adjusted. Therefore, use requirements of a user are satisfied. Meanwhile, the situation that the cable body connected to a power supply is bent repeatedly to adversely affect the service life of the data cable will be avoided.

The terminal is set as the magnetic plug, which may be magnetically connected to the peripheral connector for being plugged into the electronic device, such that the user can conveniently replace different connectors according to the model of the electronic device.

The supporting segment is set as being of the bent platy structure and thus has certain deformation performance. The conductive contact is disposed on the part of the structure, extending toward the PCB, of each supporting segment, such that the conductive contact has certain movability relative to the supporting segment. Thus, the conductive contact may be in better electrical connection with the adapter element.

The data cable according to the present invention includes the data cable plug as described above, and the adapter element. The adapter element includes the adapter plate and the cable body electrically connected to the adapter plate. The contact lines electrically connected to the metal sheets are disposed on the two opposite surfaces of the adapter plate and take the shapes of circular arcs.

The contact lines set to be in the shapes of circular arcs can well match the metal sheets to realize their electrical connection and simultaneously to realize electrical connection of the adapter element relative to the data cable plug.

The adapter plate is an arc plate and has the rotation angle of <180°. The contact line has the radian of greater than 180° and smaller than 360°.

Therefore, a range of rotation of the adapter element relative to the data cable plug can be well guaranteed to meet the user's multi-angle use requirements. Meanwhile, the service life of the data cable is prolonged.

The adapter plate includes the arc structure and also includes the two oppositely arranged main surfaces and the top surface that connects the two main surfaces. The contact lines electrically connected to the metal sheets are disposed on the top surface and at least one of the main surfaces. Since the contact lines corresponding to the metal sheets are disposed on the two main surfaces and the top surface of the adapter plate and are arranged reasonably, the metal sheets can well adapt to the contact lines. Therefore, the tight connection between the metal sheets and the contact lines is improved. Thus, rotary data cables are compact in structure.

The metal sheets include the first metal sheets corresponding to the main surfaces and the second metal sheet corresponding to the top surface. The four first metal sheets are oppositely arranged in two groups. The second metal sheet is disposed between the first metal sheets. The arrangement mode of the multiple metal sheets can be further improved while data transmission and charging are achieved, such that the structure is compact.

Figure 1:
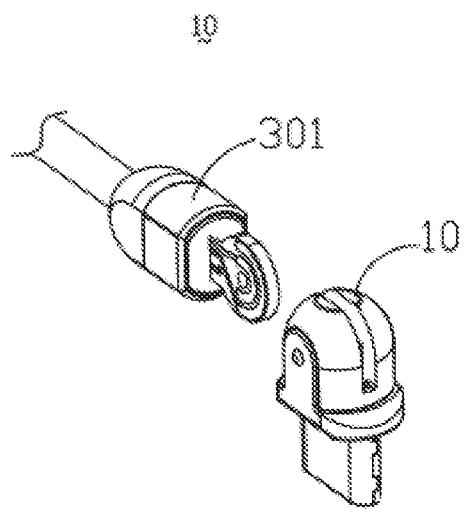
FIG. 1 is a schematic solid diagram of a data cable plug according to Embodiment 1 of the present invention.

The reference numerals represent the following components: 10—data cable plug; 101—fixing seat; 1011—base; 1012—sleeving seat; 1013—supporting plate; 1014—clamping groove; 1015—fixing hole; 102—PCB; 103—metal sheet; 1031—fixing segment; 1032—supporting segment; 1033—conductive contact; 1034—connecting segment; 104—connecting shaft; 105—first insulating part; 1051—limiting post; 106—terminal; 2063—first magnetic part; 502—second magnetic part; 20—data cable plug; 201—fixing seat; 2012—sleeving seat; 202—PCB; 2022—second metal sheet; 203—metal sheet; 2032—fixing segment; 2035—clamping segment; 2063—first magnetic part; 2064—thimble; 2065—second insulating part; 30—data cable; 301—adapter element; 3011—adapter plate; 3012—cable body; 3013—contact line; 3014—connecting hole; 3015—display hole; 3016—display light; 3017—connecting base; 3018—main surface; 3019—top surface; 50—connector; 501—connecting plug; 502—second magnetic part; 503—conducting portion; 5031—electrode contact; 5032—first contact piece; 5033—second contact piece; 5034—insulating interlayer; 5041—first contact; 5042—second contact; 5043—third contact; and 5044—fixing sheet.

DETAILED DESCRIPTION

To make objectives, technical solutions and advantages of the present invention clearer, the present invention will be described in detail below with reference to the accompanying drawings and embodiments. It should be appreciated that the specific embodiments described herein merely serve to explain the present invention and are not intended to limit the present invention.

Figure 2:
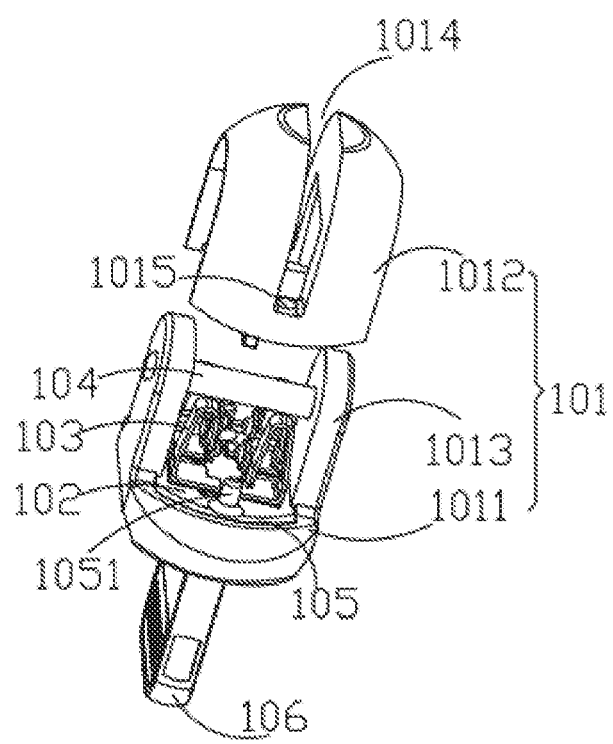
FIG. 2 is a schematic exploded diagram of a data cable plug according to Embodiment 1 of the present invention.

Referring to FIGS. 1 and 2, Embodiment 1 of the present invention provides a data cable plug 10, which is configured to be connected to an adapter element 301 to realize charging and/or data transmission of an electronic device. The data cable plug 10 is an electrical apparatus element for being plugged into an interface of the electronic device, and the adapter element 301 is an electrical apparatus element for being connected to a power supply device.

Figure 3:
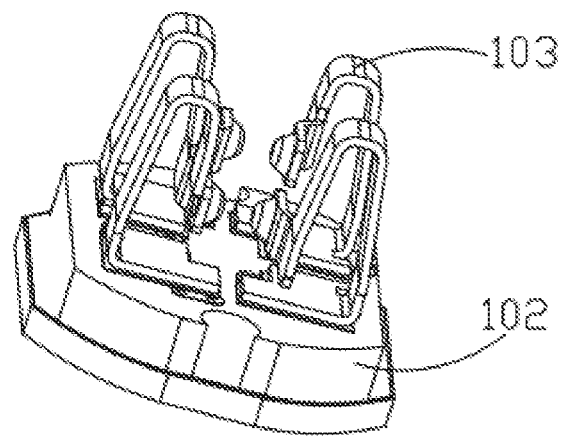
FIG. 3 is a schematic structural diagram showing connection between metal sheets and a PCB in a data cable plug according to Embodiment 1 of the present invention.

With reference to FIGS. 2 and 3, the data cable plug 10 includes a fixing seat 101, a PCB 102 and metal sheets 103. The metal sheets 103 are secured and electrically connected to the PCB 102. The fixing seat 101 includes a base 1011, a sleeving seat 1012 and two supporting plates 1013 symmetrically disposed on the base 1011. The base 1011 and the supporting plates 1013 are integrally formed. The sleeving seat 1012 sleeves the two supporting plates 1013. Optionally, in some specific implementation modes, the base 1011 and the supporting plates 1013 are made of metal materials, and the sleeving seat 1012 is made of a plastic material. In order to avoid interference of electrical signals between the PCB 102 and the base 1011, a first insulating part 105 is disposed between the PCB 102 and the base 1011. That is, the base 1011 sleeves the first insulating part 105, and the PCB 102 is fixedly connected to the first insulating part 105. The PCB 102 is secured to the base 1011 by the first insulating part 105, and one surface of the PCB 102 is exposed to the base 1011. A limiting post 1051 is disposed on the first insulating part 105. A fixing hole 1015 is formed in the sleeving seat 1012. The sleeving seat 1012 sleeves and is secured to the limiting post 1051 through the fixing hole 1015.

Continuing to refer to FIG. 2, a clamping groove 1014 for accommodating the adapter element 301 is formed in the sleeving seat 1012. The adapter element 301 is in electrical contact with the metal sheets 103 by the clamping groove 1014 to achieve the function of charging and/or data transmission. Further, a connecting shaft 104 is disposed on the supporting plates 1013. Two ends of the connecting shaft 104 are secured to the two supporting plates 1013 respectively. The adapter element 301 may be in rotational connection with the data cable plug 10 by the connecting shaft 104.

In some specific implementation modes, the metal sheets 103 are secured to a surface of the PCB 102 by means of SMT (Surface-Mount Technology). Certainly, part of the structures of the metal sheets 103 may also be secured inside the PCB 102. There are at least two metal sheets 103 which are oppositely disposed on the PCB 102 in two groups. A space for electrical connection of the adapter element 3031 is formed between the two groups of metal sheets 103. The clamping groove 1014 is communicated with the space formed between the two groups of metal sheets 103 to form a space for accommodating the adapter element 301. It can be understood that when the number of the metal sheets 103 is two, one serves as a "V+" pole, the other serves as a "V−" pole, and the electronic device is charged when the data cable plug 10 is connected to the adapter element 301.

Referring to FIG. 3, the number of the metal sheets 103 is four, and the four metal sheets 103 are averagely divided into two groups symmetrically arranged on the PCB 102. The two metal sheets 103 in one group serve as a "V+" pole and a "D−" pole respectively, and the two metal sheets 103 in the other group serve as a "V−" pole and a "D+" pole respectively. The functions of charging and data transmission may be achieved when the adapter element 301 and the data cable plug 10 are electrically connected to each other. Certainly, the polarities of the two groups of metal sheets 103 may be in other combinations so long as the functions of charging and data transmission are achieved when the metal sheets 103 are connected to the adapter element 301.

Certainly, it can be appreciated that the metal sheets 103 may be disposed on the PCB 102 side by side, that is, two oppositely arranged groups are not formed, as long as the plurality of metal sheets 103 may be successfully in electrical connection with the adapter element 301.

Figure 4:
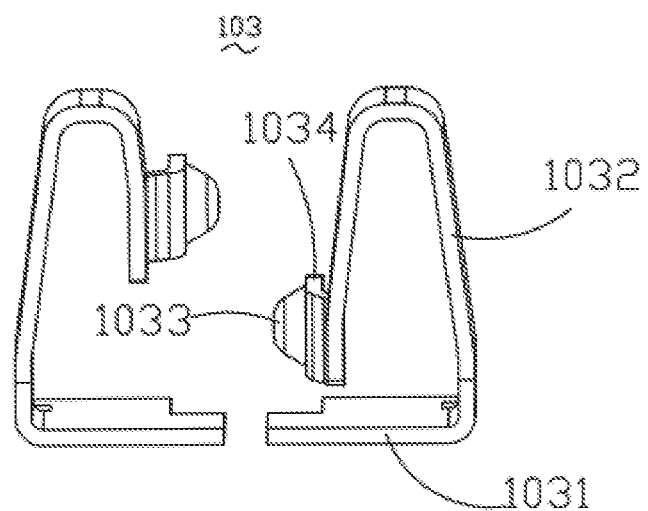
FIG. 4 is a schematic solid diagram of metal sheets in a data cable plug according to Embodiment 1 of the present invention.

Referring to FIGS. 3 and 4, the metal sheet 103 includes a fixing segment 1031 fixedly connected to the PCB 102, a supporting segment 1032 connected to the fixing segment 1031 and protruding out of the surface of the PCB and a conductive contact 1033 disposed on the supporting segment 1032 and electrically connected to the adapter element 301. The supporting segment 1032 is of a bent platy structure and is formed in such a manner that an end connected to the fixing segment 1031 extends over a certain height, then is bent, afterwards continues to extend to the side close to the PCB 102 and is not in contact with the fixing segment 1031 or the PCB 102. The conductive contact 1033 is disposed on the structure, extending toward the PCB 102, of each supporting segment 1032. The conductive contacts 1033 of the two groups of metal sheets 103 are disposed opposite to each other. A space formed by the conductive contacts 1033 of the two groups of metal sheets 1033 allows the adapter element 301 to be plugged therein.

Continuing to refer to FIGS. 3 and 4, the metal sheet 103 further includes a connecting segment 1034 connected to the structure, extending toward the PCB 102, of each supporting segment 1032. The connecting segment 1034 is a bent plate. The end, away from the supporting segment 1032, of the connecting segment 1034 protrudes toward the other group of metal sheets 103. The two conductive contacts 1033 disposed on the connecting segments of the same group of metal sheets 103 are unequally spaced from the PCB 102 and are disposed in a one-high and one-low manner to facilitate electrical connection with the adapter element 301.

Referring to FIG. 2 again, the data cable plug 10 further includes a terminal 106 for being plugged into the interface of the electronic device. The terminal 106 is electrically connected to the PCB 102. A direction in which the terminal 106 is connected to the electronic device is perpendicular to a connecting surface of the PCB 102 and the terminal 106. The PCB 102 is secured to the surface, away from the terminal 106, of the PCB 102. In the present embodiment, a direction in which the terminal 106 is connected to the interface of the electronic device is a direction in which the terminal 106 is plugged into the interface of the electronic device. The first insulating part 105 fixedly connects the terminal 106 with the PCB 102. In some specific implementation modes, the terminal 106 includes any one of a type-C terminal, a micro-USB terminal and a lightening terminal.

Figure 5:
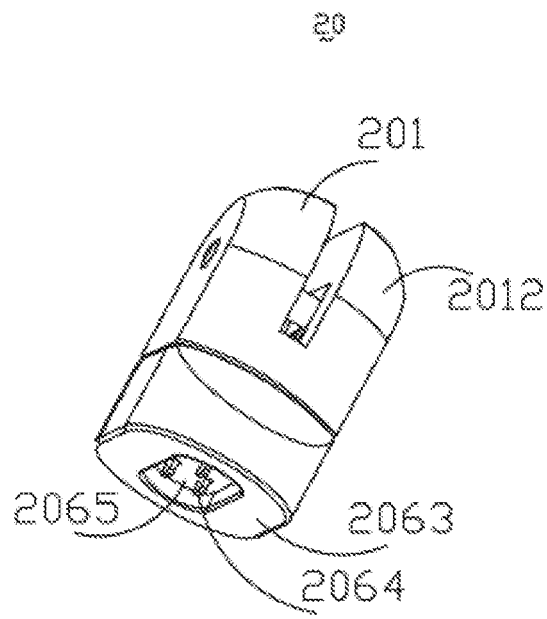
FIG. 5 is a schematic solid diagram of a data cable plug according to Embodiment 2 of the present invention.
Figure 6:
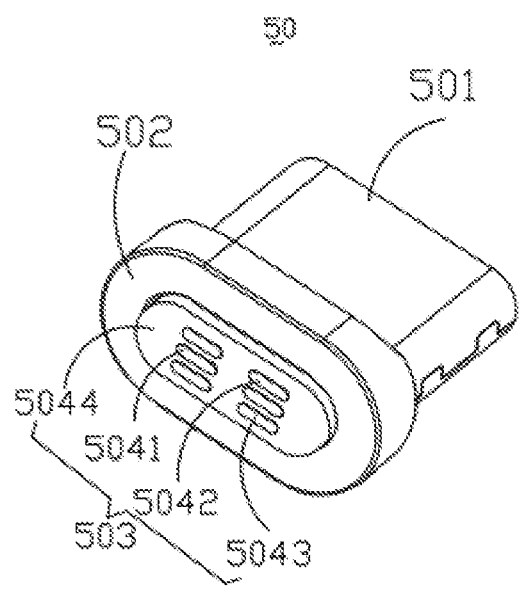
FIG. 6 is a schematic structural diagram of a peripheral connector in magnetic connection with a data cable plug according to Embodiment 2 of the present invention.

Referring to FIGS. 5 and 6, Embodiment 2 of the present invention provides a data cable plug 20, which is mainly different from the data cable plug 10 according to Embodiment 1 in that the terminal 106 is of a magnetic structure for magnetic connection with a peripheral connector 50 so as to realize data transmission and/or charging.

Figure 7:
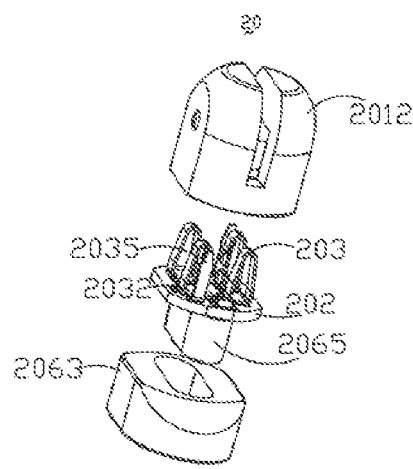
FIG. 7 is a schematic exploded diagram of a data cable plug according to Embodiment 2 of the present invention.

Referring to FIGS. 5 and 7, the data cable plug 20 includes a fixing seat 201 only including a sleeving seat 2012. This fixing seat 201 is structurally different from the fixing seat 101 of the data cable plug 10 according to Embodiment 1. Certainly, this fixing seat 201 may also be designed into the same structure as the fixing seat 101 of Embodiment 1.

In addition, in order to facilitate fixed connection between the sleeving seat 2012 and a PCB 202, a metal sheet 203 further includes a clamping segment 2035 fixedly connected to a fixing segment 2032. The clamping segment 2035 penetrates the sleeving seat 2012, such that the sleeving seat 2012 and the PCB 202 are fixedly connected to each other.

Moreover, other structures of the metal sheet 203 are the same as those in Embodiment 1, and thus, will not be repeated herein.

The data cable plug 20 further includes a first magnetic part 2063 connected to the fixing seat 201, at least one thimble 2064 disposed inside the first magnetic part 2063 and a second insulating part 2065 disposed inside the first magnetic part 2063 and isolating the thimble 2064 from the first magnetic part 2063. Optionally, when there is one thimble 2064, it serves as a "V+" pole, and the first magnetic part 2063 serves as a "V−" pole, achieving the function of charging the electronic device.

In the present embodiment, there are three thimbles 2064 spaced from one another by the second insulating part 2065. The three thimbles 2065 serve as a "V+" pole, a "D+" pole and a "D−" pole respectively to achieve the functions of charging and data transmission.

Referring to FIG. 6 again, the peripheral connector 50 includes a connecting plug 501 for being plugged into the electronic device, a conducting portion 503 connected to the connecting plug 50 and a second magnetic part 502 encircling the conducting portion 503. The conducting portion 503 is electrically connected to the connecting plug 501 that may be any one of a type-C connector, a micro-USB connector and a lightning connector. The conducting portion 503 includes a fixing sheet 5044 having at least one contact disposed thereon. Specifically, the number of the contacts corresponds to that of the thimbles 2064. When the number of the thimbles 2064 is three, the number of the contacts is correspondingly three, namely, a first contact 5041, a second contact 5042 and a third contact 5043. There may also be six contacts, which further include two contacts disposed at two sides of the first contact 5041 and one contact disposed between the second contact 5042 and the third contact 5043. In the present implementation mode, the first magnetic part 2063 and the second magnetic part 502 are elliptical, and the number of the contacts is set to be six to facilitate 180°-adaptation of the connector 50 to the data cable plug 20, thus bringing convenience to a user.

Figure 8:
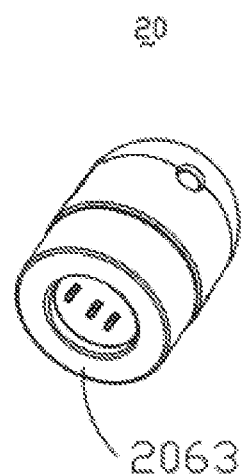
FIG. 8 is a schematic structural diagram of a data cable plug having a circular first magnetic part according to Embodiment 2 of the present invention.
Figure 9:
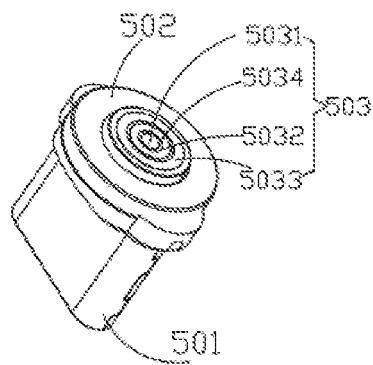
FIG. 9 is a schematic structural diagram of a peripheral connector being in magnetic connection with a data cable plug and having a circular second magnetic part according to Embodiment 2 of the present invention.

Referring to FIGS. 8 and 9, in another implementation mode of the present embodiment, the first magnetic part 2063 and the second magnetic part 502 are circular, such that the connector 50 and the data cable plug 20 magnetically attract each other by 360°. The conducting portion 503 includes an electrode contact 5031 and a plurality of contact pieces disposed on different concentric circles taking the electrode contact 5031 as the center. The contact pieces include a first contact piece 5032 and a second contact piece 5033 which are sequentially arranged concentrically around the electrode contact 5031. Insulating interlayers 5034 are disposed between the electrode contact 5031 and the first contact piece 5032, as well as between the first contact piece 5032 and the second contact piece 5033 respectively, and isolate the electrode contact 5031 from the first contact piece 5032, and the first contact piece 5032 from the second contact piece 5033 to avoid short circuit caused by contact between them. Besides, the insulating interlayers 5034 connect the electrode contact 5031, the first contact piece 5032 and the second contact piece 5033 into a whole to facilitate their connection with the connecting plug 501.

The insulating interlayer 5034 is also disposed outside the second contact piece 5033, and isolates the second contact piece 5033 from the second magnetic part 502. The second magnetic part 502 may be a conductive magnet or made from other magnetic materials. Specifically, the second magnetic part 502 may be a neodymium iron boron magnet, a samarium cobalt magnet, an aluminum nickel cobalt magnet or an iron chromium cobalt magnet, and is used as a "V−" pole. In order to guarantee that the second magnetic part 502 and the first magnetic member 2063 may well attract each other, the second magnetic part 502 and the first magnetic part 2063 have opposite polarities.

It can also be appreciated that there may be more than three thimbles 2064 as long as they are in contact with the corresponding contact pieces to improve the data transmission function or to realize fast charging.

In the present embodiment, a direction in which the terminal 106 is connected to the electronic device is perpendicular to a connecting surface of the PCB 202 and the terminal 106. The terminal 106 is plugged into the interface of the electronic device by the connector 50. The direction in which the terminal 106 is connected to the electronic device is a direction in which the connector 50 is plugged into the electronic device.

Figure 10:
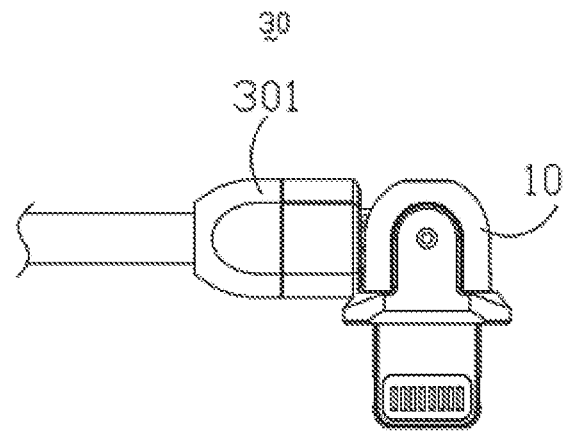
FIG. 10 is a schematic solid diagram of a data cable according to Embodiment 3 of the present invention.

Referring to FIG. 10, Embodiment 3 of the present invention provides a data cable 30, including the data cable plug 10 according to Embodiment 1 or the data cable plug 20 according to Embodiment 2, and an adapter element 301. The adapter element 301 is in rotational connection with the data cable plug 10 or the data cable plug 20 to achieve the function of data transmission or charging.

Figure 11:
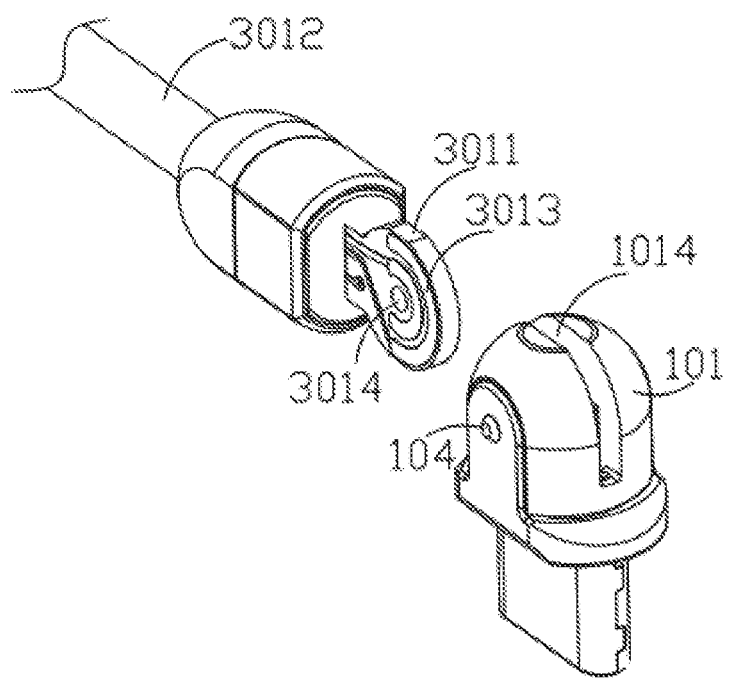
FIG. 11 is a schematic exploded diagram of a data cable according to Embodiment 3 of the present invention.
Figure 12:
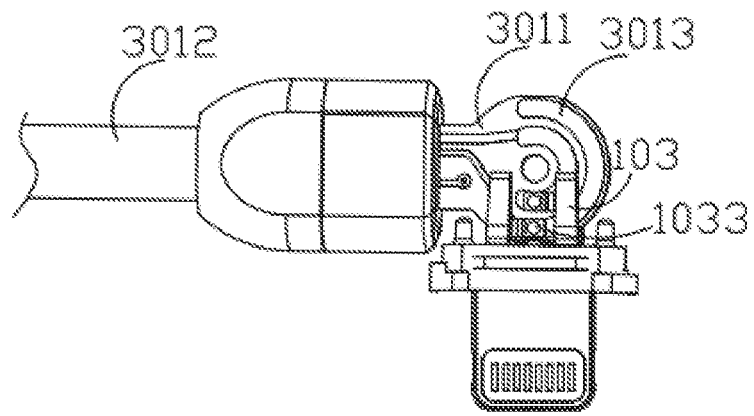
FIG. 12 is a schematic structural diagram of a data cable in which an adapter plate is electrically connected to conductive contacts of metal sheets according to Embodiment 3 of the present invention.

Referring to FIGS. 11 and 12, the adapter element 301 includes an adapter plate 3011 and a cable body 3012 electrically connected to the adapter plate 3011. A connecting hole 3014 is formed in the adapter plate 3011 and rotationally connected to the connecting shaft 104. The adapter plate 3011 is provided with contact lines 3013 electrically connected to the conductive contacts 1033 of the metal sheets 103, and the contact lines 3013 are also electrically connected to the cable body 3012. The number of the contact lines 3013 corresponds to that of the metal sheets 103. That is, there are two contact lines 3013 when the number of the metal sheets 103 is two, and one contact line 3013 is disposed on each main surface of the adapter plate 3011. The contact lines 3013 correspond to a "V+" pole and a "V−" pole respectively. When there are four metal sheets 103, the four metal sheets 103 are arranged on two opposite surfaces of the adapter plate 3011 in the form of two in each group. The contact lines 3013 are of open arc structures. That is, the contact line 3013 includes a portion of an arc structure. When there are four contact lines 3013, the two contact lines 3013 of each group are arranged in the form of concentric circles taking the connecting hole 1014 as the center. The two contact lines 3013 of a first group correspond to a "V−" pole and a "D+" pole respectively, and the two contact lines 3013 of a second group correspond to a "V+" pole and a "D−" pole respectively, endowing the data cable 30 with a charging function and a data transmission function.

It can be understood that the contact lines 3013 are arranged in two groups on the two opposite main surfaces of the adapter plate 3011 when the metal sheets 103 are oppositely arranged in two groups; and the contact lines 3013 may be only disposed on one surface of the adapter plate 3011 when the metal sheets 103 are disposed on one surface of the PCB 102 side by side.

Optionally, the contact line 3013 has a radian of greater than 180° and smaller than 360°. The adapter plate 3011 is also of a circular arc structure. That is, the adapter plate 3011 at least includes a portion of an arc structure. A rotation angle of the adapter plate 3011 is 0-180° and is smaller than or equal to 180°. The specific radian of the contact line 3013 is not limited as long as the contact line may be normally in electrical connection with the cable body 3012 and may be normally conducted within the rotation range 0-180° of the adapter plate 3011. FIG. 11 is a schematic diagram when the adapter plate is relatively rotated by 90°.

In addition, in some specific implementation modes, the adapter plate 3011 may be made of a metal material or a plastic material. The contact line 3013 may be formed on the adapter plate 3011 by means of electroplating a conductive material when the adapter plate 3011 is made of a metal material. The contact line 3013 may be formed on the adapter plate 3011 by means of melting a conductive material when the adapter plate 3011 is made of a plastic material.

Figure 13:
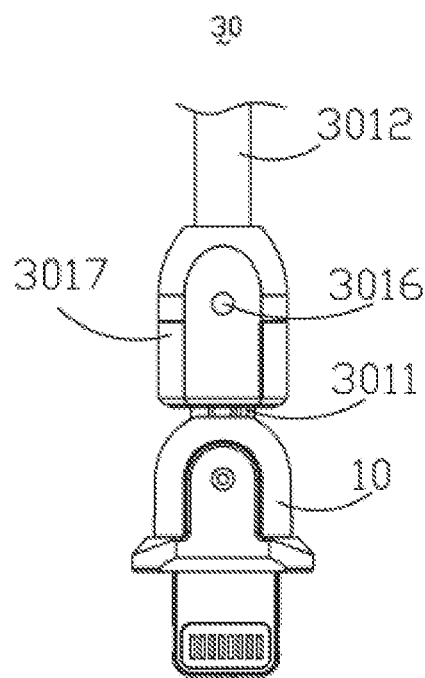
FIG. 13 is a schematic diagram of a data cable in which an adapter element is rotated by a certain angle relative to a data cable plug according to Embodiment 3 of the present invention.

Continuing to refer to FIG. 13, the adapter element 301 further includes a connecting base 3017 that fixedly connects the cable body 3012 with the adapter plate 3011. A display light 3016 is disposed on the connecting base 3017, and electrically connected to the adapter plate 3011. A working condition of the data cable 30 is indicated by the display light 3016.

Figure 14:
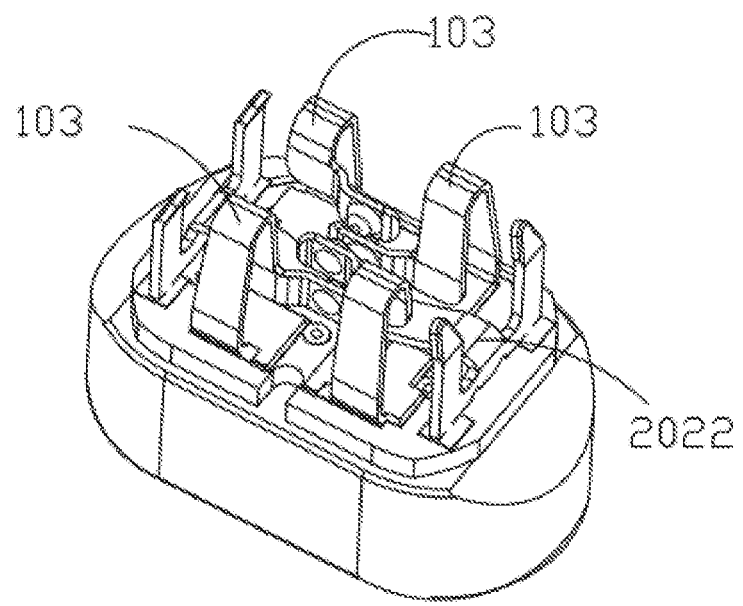
FIG. 14 is a schematic structural diagram of a data cable further including a second metal sheet according to the present invention.
Figure 15:
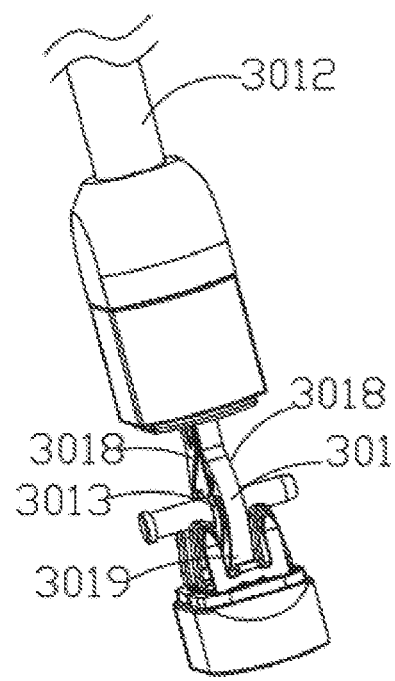
FIG. 15 is a schematic structural diagram of a data cable further including a second metal sheet cooperating with an adapter element according to the present invention.

Referring to FIGS. 14 and 15, in some other implementation modes, the adapter plate 3011 further includes a top surface 3019 that connects two main surfaces 3018. The contact lines 3013 electrically connected to the metal sheets 103 are disposed on the main surfaces 3018. The data cable 30 further includes a second metal sheet 2022 corresponding to the top surface 3019 and disposed between the metal sheets 103. The top surface 3019 is provided with a contact line 3013 corresponding to the second metal sheet 2022.

The number of the metal sheets 103 is four, the four metal sheets 103 are oppositely disposed in two groups, and the metal sheets 103 and the second metal sheet 2022 are defined as a D+ pin, a D− pin, a Vcc+ pin, a GND pin and a CC pin.

Figure 16:
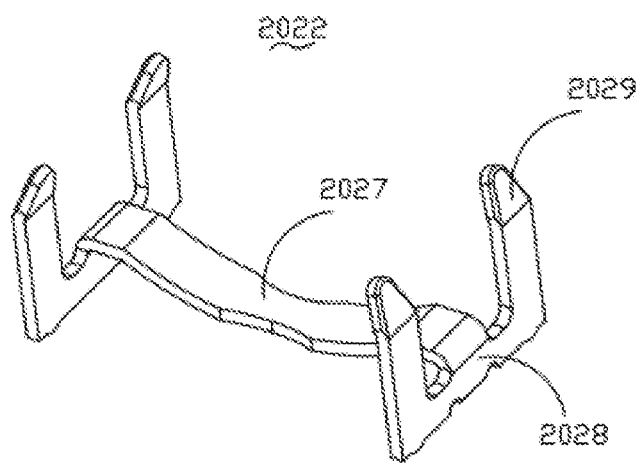
FIG. 16 is a schematic solid diagram of a second metal sheet according to the present invention.

Referring to FIG. 16, the second metal sheet 2022 includes a conductive portion 2027 corresponding to the top surface 3019 and fixing portions 2028 connected to two sides of the conductive portion 2027. The fixing portions 2028 and the conductive portion 2027 are connected to form an I shape. The fixing portions 2028 are electrically connected to the PCB 202. Each fixing portion 2028 at least includes two connecting points that are simultaneously in electrical connection with the PCB 202, which improves the stability in signal transmission and avoids a poor contact caused when a single conductive connecting point is disconnected. The conductive portion 2027 is arc-shaped and is not in contact with the PCB 202. The conductive portion 2027 is bent toward the side close to the PCB 202 to form an arc structure. In this way, during the rotational connection of the conductive portion with the adapter plate 301, a contact area therebetween is increased and the conducting stability is improved. The conductive portion 2027 may be a steel sheet having certain elastic deformation performance.

Compared with the prior art, the data cable according to the present invention includes the data cable plug and the adapter element which are in rotational connection. The data cable plug includes at least two metal sheets opposite to each other. The space for rotational connection of the adapter element is formed between two of the metal sheets. The adapter element is provided with the contact lines electrically connected to the metal sheets and the contact lines include arc structures. When the adapter element is rotationally connected in the space, not only can the electrical connection between the adapter element and the data cable plug be guaranteed, but also an angle of the adapter element relative to the data cable plug can be well adjusted. Therefore, use requirements of a user are satisfied. Meanwhile, the situation that the cable body connected to a power supply is bent repeatedly to adversely affect the service life of the data cable will be avoided.

The terminal is set as the magnetic plug, which may be magnetically connected to the peripheral connector for being plugged into the electronic device, such that the user can conveniently replace different connectors according to the model of the electronic device.

The supporting segment is set as being of the bent platy structure and thus has certain deformation performance. The conductive contact is disposed on the part of the structure, extending toward the PCB, of each supporting segment, such that the conductive contact has certain movability relative to the supporting segment. Thus, the conductive contact may be in better electrical connection with the adapter element.

The data cable according to the present invention includes the data cable plug as described above, and the adapter element. The adapter element includes the adapter plate and the cable body electrically connected to the adapter plate. The contact lines electrically connected to the metal sheets are disposed on the two opposite surfaces of the adapter plate and take the shapes of circular arcs. The contact lines set to be in the shapes of circular arcs can well match the metal sheets to realize their electrical connection and simultaneously to realize electrical connection of the adapter element relative to the data cable plug.

The adapter plate is an arc plate having the rotation angle of <180°. The contact line has the radian of greater than 180° and smaller than 360°. Therefore, a range of rotation of the adapter element relative to the data cable plug can be well guaranteed to meet the user's multi-angle use requirements. Meanwhile, the service life of the data cable is prolonged.

The descriptions set forth above are merely preferred embodiments of the present invention, and are not intended to limit the present invention. Any modification, equivalent substitution and improvement made within the principles of the present invention should be included in the scope of protection of the present invention.

The invention claimed is:

1. A data cable, comprising a data cable plug and an adapter plate which are in rotational connection, wherein the data cable plug comprises at least two metal sheets, the adapter plate is provided with contact lines electrically connected to the at least two metal sheets; the contact lines and the adapter plate are configured as arc structures, and the rotation angle of the adapter plate is smaller than or equal to 180°.

2. The data cable according to claim 1, wherein the adapter plate comprises two main surfaces which are oppositely arranged and a top surface which connects the two main surfaces, the two main surfaces are provided with the contact lines; the at least two metal sheets are oppositely disposed and define a space for rotational connection to the adapter plate, and the adapter plate is accommodated in the space, the at least two metal sheets respectively contact with the two main surfaces of the adapter plate.

3. The data cable according to claim 1, wherein the contact line has a radian of greater than 180° and smaller than 360°.

4. The data cable according to claim 1, further comprising a fixing seat provided with a clamping groove for adaptation of the adapter plate, and the clamping groove is communicated with the space formed between the metal sheets to form a space for adaptation of the adapter plate.

5. The data cable according to claim 2, wherein the number of the metal sheets is four, the four metal sheets are divided into two groups, and the two metal sheets in each group are symmetrically disposed.

6. The data cable according to claim 2, wherein at least one contact line is disposed on each main surface, and the contact lines on the same main surface are disposed in the form of concentric circles when the number of the contact lines on each main surface is greater than or equal to two.

7. The data cable according to claim 2, wherein the data cable further comprises a second metal sheet corresponding to the top surface and disposed between the at least two metal sheets, and the top surface is provided with the contact lines corresponding to the second metal sheet.

8. The data cable according to claim 4, further comprising a connecting shaft that passes through the fixing seat and the adapter plate.

9. The data cable according to claim 7, wherein the number of the metal sheets is four, the four metal sheets are oppositely disposed in two groups, and the metal sheets and the second metal sheet are defined as a D+ pin, a D− pin, a Vcc+ pin, a GND pin and a CC pin.

10. The data cable according to claim 4, further comprising a PCB and a terminal for being connected to an interface of an electronic device, the metal sheets and the second metal sheet are disposed on the side, close to the adapter plate, of the PCB, the fixing seat fixedly and electrically connects the PCB with the terminal, and a direction in which the terminal is connected to the electronic device is perpendicular to a connecting surface of the PCB and the terminal.

11. The data cable according to claim 10, wherein the terminal is configured to be plugged into the interface of the electronic device and comprises any one of a type-C terminal, a micro-USB terminal and a Lightning terminal; or the terminal is a magnetic plug capable of being magnetically connected to a peripheral connector for being plugged into the electronic device.

12. The data cable according to claim 10, wherein the metal sheet comprises a fixing segment fixedly connected to the PCB, a supporting segment connected to the fixing segment and protruding out of a surface of the PCB and a conductive contact disposed on the supporting segment and electrically connected to the adapter plate.

13. The data cable according to claim 11, wherein when being the magnetic plug, the terminal comprises a first magnetic part connected to the fixing seat and at least one thimble disposed inside the first magnetic part; the thimble is electrically connected to the PCB and the peripheral connector; the peripheral connector comprises a second magnetic part; the first magnetic part and the second magnetic part are designed to be circular or elliptical; and the terminal magnetically attracts the peripheral connector by 360° or adapts to the peripheral connector by 180°.

14. The data cable according to claim 12, wherein the supporting segment is of a bent platy structure and is formed in such a manner that an end connected to the fixing segment extends over a certain height, then is bent, afterwards continues to extend to a side close to the PCB and is not in contact with the PCB; and the conductive contact is disposed on part of the structure, extending toward the PCB, of each supporting segment, and a space for accommodating the adapter plate is formed between the two groups of opposite conductive contacts.

15. The data cable according to claim 12, wherein the metal sheet further comprises a connecting segment connected to the part of the structure, extending toward the PCB, of each supporting segment; the connecting segment is a bent plate; the end, away from the supporting segment, of the connecting segment protrudes toward one group of opposite metal sheets; and the two contacts connected to the connecting segments of the same group of metal sheets are unequally spaced from the PCB.

* * * * *